United States Patent
Wall et al.

(10) Patent No.: US 12,402,263 B2
(45) Date of Patent: Aug. 26, 2025

(54) DISPLAY DEVICE FOR OUTPUTTING PIXEL-BASED DISPLAY CONTENT, CARRIER ELEMENT FOR THE DISPLAY DEVICE, AND MOTOR VEHICLE HAVING THE DISPLAY DEVICE

(71) Applicant: AUDI AG, Ingolstadt (DE)

(72) Inventors: Christian Wall, Hitzhofen (DE); Johannes Herold, Dresden (DE); Jens Schirmer, Dresden (DE)

(73) Assignee: AUDI AG, Ingolstadt (DE)

( * ) Notice: Subject to any disclaimer, the term of this patent is extended or adjusted under 35 U.S.C. 154(b) by 0 days.

(21) Appl. No.: 18/579,758

(22) PCT Filed: Jul. 8, 2022

(86) PCT No.: PCT/EP2022/069117
§ 371 (c)(1),
(2) Date: Jan. 16, 2024

(87) PCT Pub. No.: WO2023/006386
PCT Pub. Date: Feb. 2, 2023

(65) Prior Publication Data
US 2024/0324124 A1    Sep. 26, 2024

(30) Foreign Application Priority Data
Jul. 19, 2021   (DE) .................... 10 2021 118 525.4

(51) Int. Cl.
*H05K 5/02* (2006.01)
*B60K 35/53* (2024.01)
(Continued)

(52) U.S. Cl.
CPC ............ *H05K 5/0217* (2013.01); *B60K 35/53* (2024.01); *G06F 3/041* (2013.01); *G06F 2203/04102* (2013.01); *H05K 5/0018* (2022.08)

(58) Field of Classification Search
CPC .... H05K 5/0217; H05K 5/0018; B60K 35/53; B60K 2360/1438; B60K 35/10;
(Continued)

(56) References Cited

U.S. PATENT DOCUMENTS 10,194,543 B2   1/2019  Seo et al.
2021/0144868 A1*  5/2021  Song .................... H05K 5/0026

FOREIGN PATENT DOCUMENTS

DE   10 2019 127 436 B3   12/2020
DE   10 2019 126 205 A1   4/2021
(Continued)

OTHER PUBLICATIONS

PCT/ISA/210 dated Dec. 7, 2022 in International Patent Application No. PCT/EP2022/069117
(Continued)

*Primary Examiner* — Jonathan A Boyd
(74) *Attorney, Agent, or Firm* — STAAS & HALSEY LLP

(57) ABSTRACT

A display device to display content, comprising a display film to display the content; and a flexible carrier element including a rear side which bears the display film; and a rolling mechanism to allow at least a part of the display film and at least a part of the flexible carrier element to roll about a rolling-up axis so as to form a roll shape. The flexible carrier element is configured as a carrier film on which is configured a support structure that projects perpendicular from the carrier film and extends on a side of the carrier film facing away from the display film. The support structure has
(Continued)

a plurality of cells open on one side and delimited on an opposite side by a cell base with cell sides delimited by cell walls projecting perpendicular where a cell wall is shared in pairs to thereby form a honeycomb structure.

13 Claims, 6 Drawing Sheets

(51) Int. Cl.
*G06F 3/041* (2006.01)
*H05K 5/00* (2006.01)

(58) Field of Classification Search
CPC ...... B60K 35/223; B60K 35/50; B60K 35/00; G06F 3/041; G06F 2203/04102; G06F 1/1652; G09G 3/3208; G09G 2354/00; G09G 2380/02; G09G 2380/10; G09G 3/035; G09F 9/301; G09F 21/049
See application file for complete search history.

(56) References Cited

FOREIGN PATENT DOCUMENTS

| DE | 10 2021 118 525.4 | 7/2021 |
| EP | 2 283 636 B1 | 10/2014 |
| EP | 3 599 503 B1 | 8/2020 |
| EP | 3 477 424 B1 | 9/2021 |
| KR | 10-2016-0017843 | 2/2016 |
| WO | WO 2019/112814 A1 | 6/2019 |
| WO | PCT/EP2022/069117 | 7/2022 |

OTHER PUBLICATIONS

PCT/ISA/237 dated Jul. 8, 2022 in International Patent Application No. PCT/EP2022/069117.
Office Action dated Mar. 11, 2022 in German Patent Application No. 10 2021 118 525.4.
Translation by WIPO of International Preliminary Report on Patentability for PCT/EP2022/069117 dated Feb. 1, 2024 (Forms PCT/IB/338; PCT/IB/373; PCT/ISA/237).

* cited by examiner

DISPLAY DEVICE FOR OUTPUTTING PIXEL-BASED DISPLAY CONTENT, CARRIER ELEMENT FOR THE DISPLAY DEVICE, AND MOTOR VEHICLE HAVING THE DISPLAY DEVICE

CROSS-REFERENCE TO RELATED APPLICATIONS

This application is a U.S. national stage of International Application No. PCT/EP2022/069117, filed on Jul. 8, 2022, which claims the priority benefit of German Patent Application No. 10 2021 118 525.4 filed on Jul. 19, 2021. Both the International Application No. PCT/EP2022/069117 and the German Patent Application No. 10 2021 118 525.4 are incorporated by reference herein in their entirety.

BACKGROUND

1. Field

Disclosed herein is a display device for outputting pixel-based display content. The display device may comprise a display film and a flexible carrier element on which a rear side of the display film is arrangeable so as to carry and/or support the latter. A rolling mechanism for rolling up at least a part of the display film and at least a part of the flexible carrier element is provided. Also disclosed herein is a carrier element as a component for the display device, and a motor vehicle having the display device.

2. Description of the Related Art

For displaying information in modern motor vehicles, one or a plurality of displays (monitors) are almost exclusively used. Depending on the driving situation, a display size of different dimensions is often required here. For some considerable time already, this situation has been addressed by deploying or retracting the display. While ever larger displays have recently been used in modern motor vehicles, with displays becoming ever more central elements in the design of the cockpit as a result, this increasingly poses the problem of hiding displays of such large size within the vehicle console when not in use. Current developments in the field of flexible display panels increasingly allow the trend to move away from stiff display movements moved in a linear manner toward bendable components which are able to utilize the available space in the vehicle console far more flexibly and efficiently.

In order to address the aforementioned installation space situation in the interior, solutions based on flexible display elements can be seen ever more frequently, this also being due to the rapid developments in the field of bendable displays. The small thickness of displays of this type results in most instances in a likewise flexible display carrier being required for assembly in a superordinate module. A flexible display element can be provided by means of a so-called display film such as may be implemented based on OLEDs (organic light emitting diodes).

EP 2 283 636 B1 shows a protective device for a flexible display device having a display screen with such a display film. The display screen is provided with stiffening elements which are disposed at regular spacings so as to run parallel to a rolling-up axis in order to maintain a rolling-up capability of the display device.

EP 3 599 503 B1 shows a display device having a flexible substrate of an OLED display and a rear-side rigid cover which is optimized in terms of strength and provided with reinforcement ribs.

WO 2019/112 814 A1 shows a flexible display device having a carrier structure. The carrier structure has a stiffening function so as to restrict bendability in a predefined direction.

SUMMARY

An aspect of the invention includes mounting and supporting a display film in a display device in such a manner that rolling-up is made possible and sufficient mechanical support of the display film is provided during manual touch operation when designed as a touch display.

A display device for outputting pixel-based display content. The display device may include as components at least: a display film or screen film to display the display content; and a flexible carrier element on which a rear side of the display film rests or bears; a rolling mechanism for rolling up at least part of the display film and of the flexible carrier element about a rolling-up axis so as to form a roll shape.

An aspect of the invention includes the carrier element configured as a carrier film on which is configured a support structure that projects perpendicularly from the carrier film and extends on a side of the carrier film facing away from the display film. "Carrier film" means that one side of the carrier element is a layer or film of which one side may be smooth (so as to bring to bear the display film), and the support structure is configured on the other side of the layer or film.

In order for the carrier element now to be designed to be capable of flexible rolling-up and nevertheless offer sufficient stiffness so that, when touched by a finger, the resulting operating force can be absorbed, it is provided that the support structure has a plurality of cells which are open on one side and which are in each case delimited toward their cell base by the carrier film and are in each case delimited toward all cell sides by cell walls projecting perpendicularly from the carrier film, wherein the cells each share a cell wall in pairs and in this way form a honeycomb structure. In other words, the support structure comprises the arrangement of cell walls projecting perpendicularly from the carrier film. The maximum external dimension of the cells, for example, may result in a diameter which is smaller than five centimeters, in particular smaller than two centimeters (measured parallel to the carrier film or the cell base). The depth of the respective cell, i.e. the height of the cell walls above the carrier film may be, for example, smaller than two centimeters, in particular smaller than one centimeter. By adjusting the diameter and the depth, for example, it is possible to set a bending radius up to which the carrier element can be curved to the maximum without being damaged or destroyed.

In a manner known per se, the display film can be designed as a so-called flexible display or rolling-capable display such as can be implemented based on OLED technology. A synonymous description is "monitor screen film". In order to roll up the carrier element conjointly with the display film resting or bearing thereon, the rolling mechanism can have a rolling member, for example a cylindrical member, or rolling-up can take place as a hollow roll, i.e. the carrier element and the display film form the shell of a hollow cylinder when they are rolled up about the rolling-up axis. The axis of the cylinder in this instance forms the rolling-up axis or bending axis. A bending radius herein may be, for example, in a range from one centimeter to 15 centimeters. Rolling up does not have to result in a complete cylinder; it is sufficient, for example, that only three quarters of a cylinder, or half a cylinder, is formed by the roll shape.

One refinement comprises that the carrier element has assembly regions which are free of the support structure (structure-free) and which are designed to be elongate or strip-shaped, wherein the direction of longitudinal extent thereof is aligned parallel to the rolling-up axis. It is additionally provided that, in the carrier element, a respective rigid support bar or carrier bar is configured on the carrier film in the respective assembly region, and the respective carrier bar has an assembly installation having at least one contact point for fastening an electrical and/or mechanical component. In other words, strips or grooves are cut out in the honeycomb structure, which extend parallel to the rolling-up axis, thus parallel to the cylinder axis, on the shell face in the case of the roll shape. Such an assembly region is thus recessed in the honeycomb structure and does not interfere when rolling up the carrier element. A bar-shaped carrier (carrier bar) extends in the respective assembly region; i.e. a solid bar is configured here instead of the honeycomb structure. A component such as, for example, a cable or a cooling feature or a mounting or a roll, can be fastened to the carrier bar by way of the respective contact point. A thickness of the respective carrier bar may be, for example, smaller than or equal to the cell height of the cell walls in the part of the honeycomb structure contiguous to the assembly regions, so that the carrier bar remains recessed in terms of the height in the honeycomb structure, or does not project beyond the height. In terms of length, the carrier bars, for example, may extend from one periphery of the carrier element to the opposite periphery of the carrier element, or a respective end of the carrier bar has a spacing in a range from three centimeters to 0.5 centimeters from the respective peripheral element. In this instance, the honeycomb structure in the remaining region can still continue up to the periphery of the carrier element. A respective width of the respective carrier bar (measured along the circumferential direction of the roll shape) can be in a range from 0.5 centimeters to 3 centimeters. In particular, the width of the respective carrier bar in terms of the mutual spacing of the carrier bars is chosen to be at a ratio of less than 1:3; i.e. the mutual spacing of the carrier bars is at least three times the width of the carrier bars. It is achieved as a result that the rolling-up capability so as to form the roll shape is nevertheless guaranteed by the stiffness of the (solid) carrier bars, which is greater than the stiffness of the honeycomb structure.

One refinement may comprise the carrier element with the carrier film and the cells walls projecting perpendicularly therefrom and the carrier bars are integrally designed. In other words, the respective carrier bar is also configured or integrally molded as a rib on the carrier film. The carrier element can be molded or designed or produced by injection molding or 3D casting, for example. In this instance, the carrier film, the honeycomb structure and the carrier bars are contained in the integral component created. A plastics material can be used as flexible material. Additionally or alternatively thereto, rubber and/or silicone may be included. As a result of the integral design, for example, it is avoided during rolling up and/or unrolling of the carrier element, thus during retracting or deploying the carrier element and the display film, that a gap can be created between these elements.

One refinement, for example, provides that the respective carrier bar has a cross-sectional profile in which a taper is configured in the region of the lateral walls, and/or which has a smaller width on a carrier base, where the carrier bar transitions into the carrier film, than on an opposite carrier side (on which the at least one contact point may be disposed). In other words, the respective carrier bar in the cross-sectional profile (when viewed perpendicularly to the longitudinal axis of the carrier bar) is T-shaped, or H-shaped, or V-shaped. In other words, a carrier bar can have a T-beam profile. The constricted shape results in the advantage that the lateral walls of the carrier bar that end on the carrier film of the carrier element are not perpendicular on the carrier film but have a curved, concave shape, thus being able to yield or flexibly deform when rolling up so as to form the roll shape. It can be prevented by the choice of the width of the narrower carrier base (carrier base on which the carrier film stands) that an undesirably large local rolling-up radius (in comparison to the contiguous honeycomb structure) is formed during rolling up.

One refinement, for example, comprises that the cells are designed as rectangular honeycombs and two of the cell walls herein are in each case aligned along an axial direction parallel to the rolling-up axis, and the other two cell walls are aligned along a circumferential direction of the roll shape, wherein a direction of longitudinal extent of the rectangular honeycombs is aligned parallel to the rolling-up axis. In other words, the honeycombs are designed as elongate rectangles of which the length is greater than their width (irrespective of the height perpendicular to the carrier film). The honeycombs are of elongate shape and are parallel to the rolling-up axis by way of their direction of longitudinal extent, i.e. the longer cell walls are only bent laterally, transversely to the wall face during rolling up, but the wall face does not have to be compressed. Only the shorter cell walls, which extend in the circumferential direction of the roll shape, have to be compressed. The wall thickness of the shorter cell walls may be, for example, also thinner or less than the wall thickness of the longer cell walls. In this arrangement, the carrier element can be deformed so as to form the roll shape with little complexity in terms of deformation. At the same time, the carrier element offers a reliable structural reinforcement in relation to an operating force acting on the carrier film when the carrier film is rolled out flat.

One refinement comprises that the cells of the honeycomb structure are disposed in cell rows which run, or are disposed, parallel to the rolling-up axis. The cell walls of those cells that extend perpendicularly to the rolling-up axis, thus the transversely running cell walls or those cell walls of which the surface normal is aligned parallel to the rolling-up axis, are disposed so as to be mutually offset in the case of respective adjacent cell rows. In other words, only the cell walls that in the longitudinal direction of the cells extend parallel to the rolling-up axis form continuous cell walls which extend or run along a plurality of individual cells. In contrast, the cell walls running transversely or perpendicularly thereto are mutually offset in such a manner.

One refinement comprises that configured in the honeycomb structure are dissimilar cell groups of the cells which differ from one another due to at least one dissimilar cell dimension in terms of a cell wall height and/or an aspect ratio of a cell length (measured parallel to the rolling-up axis) and a cell width perpendicular to the rolling-up axis (measured parallel to the carrier film, i.e. the cell base), and/or in terms of the cell length and/or cell width. In other words, by adjusting the dissimilar cell dimensions, a height profile and/or a location-dependent stiffness can be adjusted by the honeycomb structure in the carrier element.

One refinement comprises that a cell wall thickness of the cell walls that extend parallel to the rolling-up axis is greater than a cell wall thickness of the cell walls that extend perpendicularly to the rolling-up axis. As a result thereof, a stiffness of the carrier element can be adjusted by the cell walls that are disposed or extend parallel to the rolling-up axis, while the thinner cell walls can be folded, kinked or compressed perpendicularly thereto when the carrier element is rolled in or rolled up.

As a further solution, as an example, a carrier element is included in the display device. The carrier element is produced in the manner described from at least one flexible material and is configured as a carrier film on which is configured a support structure projecting perpendicularly from the carrier film, wherein the support structure has a plurality of cells which are open on one side and which are delimited toward the cell base by the carrier film and are delimited toward all cell sides by cell walls projecting perpendicularly from the carrier film, wherein the cells each share a cell wall in pairs and in this way form a honeycomb structure. The carrier element can be utilized in the manner described as a carrier for a display film in a display device. For operation, the carrier element, conjointly with the display film disposed on the latter on the carrier film, can be unrolled and arranged so as to protrude flat into a space, while at least part of the carrier element can then be rolled up so as to form a roll shape in a stowage position, for example so as to form a quarter of a cylinder, or half a cylinder, or three quarters of a cylinder, or a complete cylinder, to mention only a few examples.

An aspect of the invention also comprises refinements of the carrier element with features that have already been described in the context of the refinements of the display device. For this reason, the corresponding refinements of the carrier element are not described yet again here.

As a further solution, as an example, a motor vehicle incudes a display device. The motor vehicle according to an example of the invention may be designed as an automobile, in particular a passenger motor vehicle or commercial motor vehicle, or as a passenger bus or motorcycle. In the motor vehicle, the display device can be installed in an operator console, for example, into which part of the display film and of the carrier element can then be rolled in should the entire display surface of the display film in the current display mode not be required. For example, in the motor vehicle, the rolling mechanism may have been disposed in the operator console or dashboard of the motor vehicle, the roller mechanism being able to roll up the carrier element, with the display film disposed thereon, at least in part within the operator console so that the carrier element with the display film assumes the roll shape. If the display film is then to be deployed in the display device, the carrier element with the display film disposed thereon can be unrolled, and the display surface of the display device can in this way be deployed, for example through a slot of the operator console, in the interior of the motor vehicle, or extended so as to protrude into the latter. The observer, by the display film, is then presented with a flat display surface which is held or supported by the carrier element.

Aspects of the invention also comprises the combinations of the features of the embodiments described. Aspects of the invention thus also comprise implementations which have in each case a combination of a plurality of the embodiments described, unless the embodiments have been described as mutually exclusive.

BRIEF DESCRIPTION OF DRAWINGS

These and other aspects and advantages will become more apparent and more readily appreciated from the following description of the exemplary embodiments, taken in conjunction with the accompanying drawings of which.

Examples of the invention are described hereunder.

DETAILED DESCRIPTION

Figure 1:
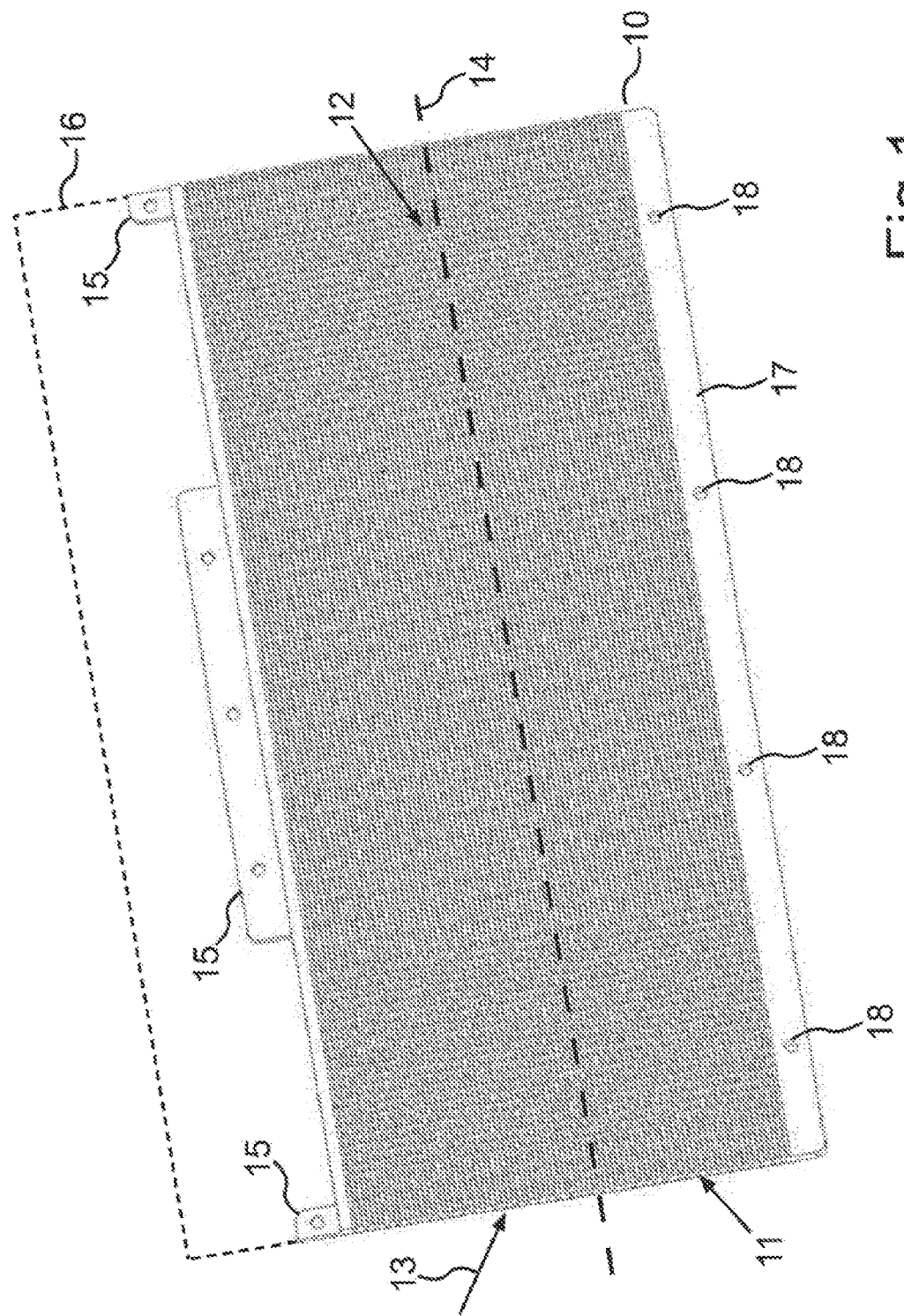
FIG. 1 shows a schematic illustration of an example of a carrier element according to an aspect of the invention.

Reference will now be made in detail to the preferred embodiments, examples of which are illustrated in the accompanying drawings, wherein like reference numerals refer to like elements throughout.

The exemplary embodiments explained hereunder are preferred embodiments of the invention. In the exemplary embodiments, the described components of the embodiments represent in each case individual features of the invention which are to be considered independently of one another and which also in each case refine the invention independently of one another. Therefore, the disclosure is to comprise also combinations of the features of the embodiments other than those illustrated. Furthermore, the embodiments described can also be enhanced by further features of the invention that have already been described.

In the figures, the same reference signs denote in each case functionally equivalent elements.

FIG. 1 shows an example of a carrier element 10 (a flexible carrier element 10) on the rear side 11 of which (in the view of FIG. 1) a flexible display film can be disposed. The carrier element 10 can be a constituent part of a display device, or be provided as a component for such a display device. The carrier element 10 can have a honeycomb structure 12 by way of which a stiffness of the carrier element 10 for an operating force 13 acting on the rear side 11 can be achieved with little effort in terms of material and weight. Additionally, however, the carrier element 10 is able to be rolled up about a bending axis or rolling-up axis 14.

For rolling up, a material of the carrier element 10 can be designed to be flexible or soft, for example on the basis of a plastics material and/or silicone and/or rubber. Tabs 15, on which an additional plate 16 for extending a display surface of the display film on the rear side 11 can be disposed, can be integrally molded on the carrier element 10. A fastening installation 18, for example in the form of a further tab, can be provided on an opposite edge 17, so as to fasten a rolling mechanism for rolling up the carrier element 10 about the rolling-up axis 14.

Figure 2:
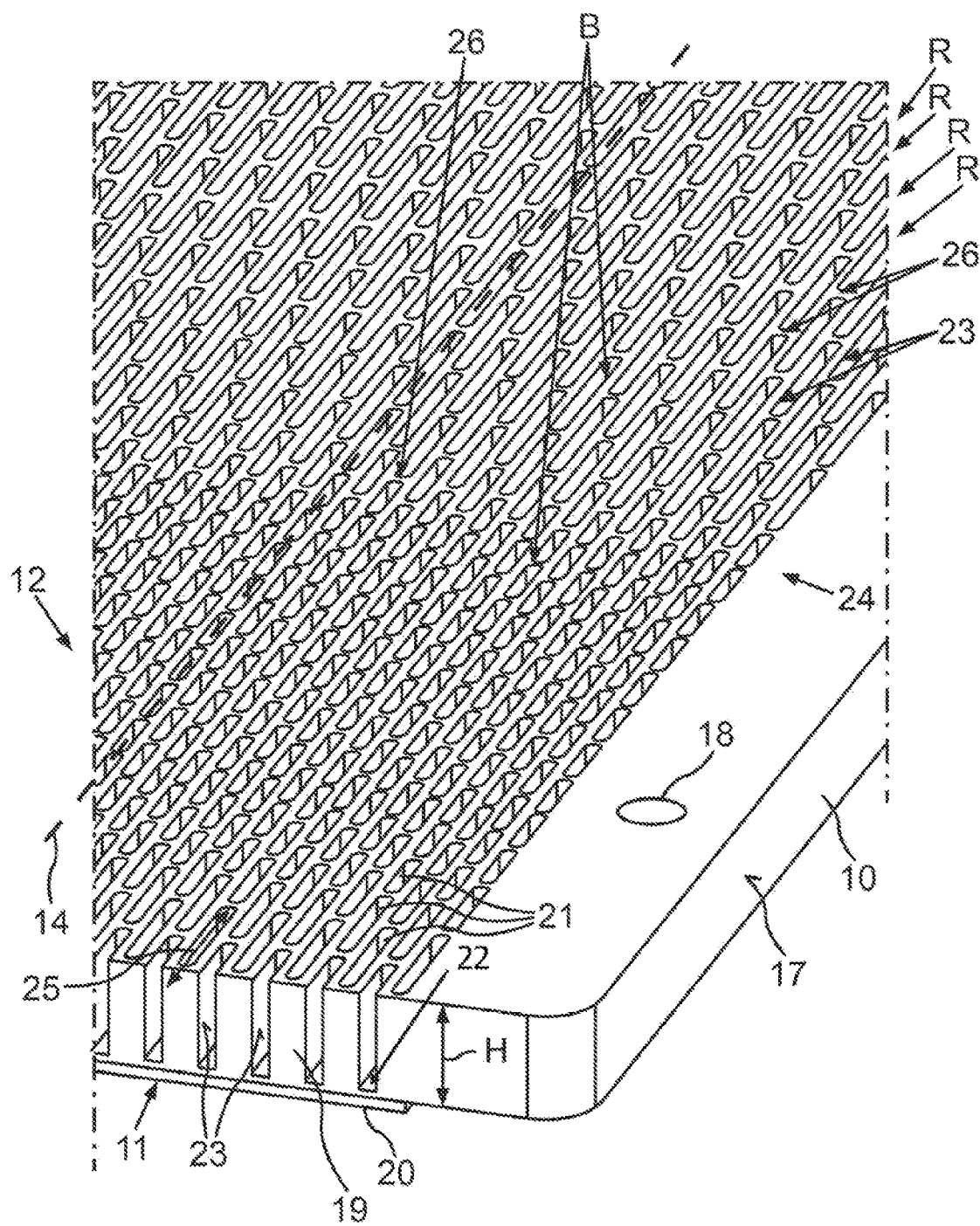
FIG. 2 shows a schematic illustration of a honeycomb structure of a carrier element of FIG. 1.

FIG. 2 visualizes the honeycomb structure 12 according to an example of FIG. 1. It is illustrated how the rear side 11 of the carrier element 10 can be designed as a carrier film 19 on which the display film 20 can be disposed. The carrier film 19 represents a cell base 22 for individual cells 21 of the honeycomb structure 12. For reasons of clarity, only a few cells 21 are provided with a reference sign. Proceeding from the carrier film 19, cell walls 23 projecting perpendicularly from the carrier film 19 can be integrally molded on the carrier element 12. The cells 21 are open on one side, which is to say that the cells 21 are delimited by the cell walls 23 and the cell base 22, and the cells 21 are open only toward the illustrated front side 24 of the honeycomb structure 12. The cells 21 are of elongate shape and rectangular, wherein a direction of longitudinal extent 25 is aligned parallel to the rolling-up axis 14. The cell walls 23, which are aligned parallel to the rolling-up axis 14 and establish the direction of longitudinal extent 25, are for example thicker, equipped with a thicker wall thickness, than cell walls 26 which are aligned perpendicularly thereto. A cell depth or cell height H of the cells 21 results from the height of the cell walls 23, 26. Cell groups B, the cells 21 of which differ as a result of their dissimilar dimensions, can be formed.

Figure 3:
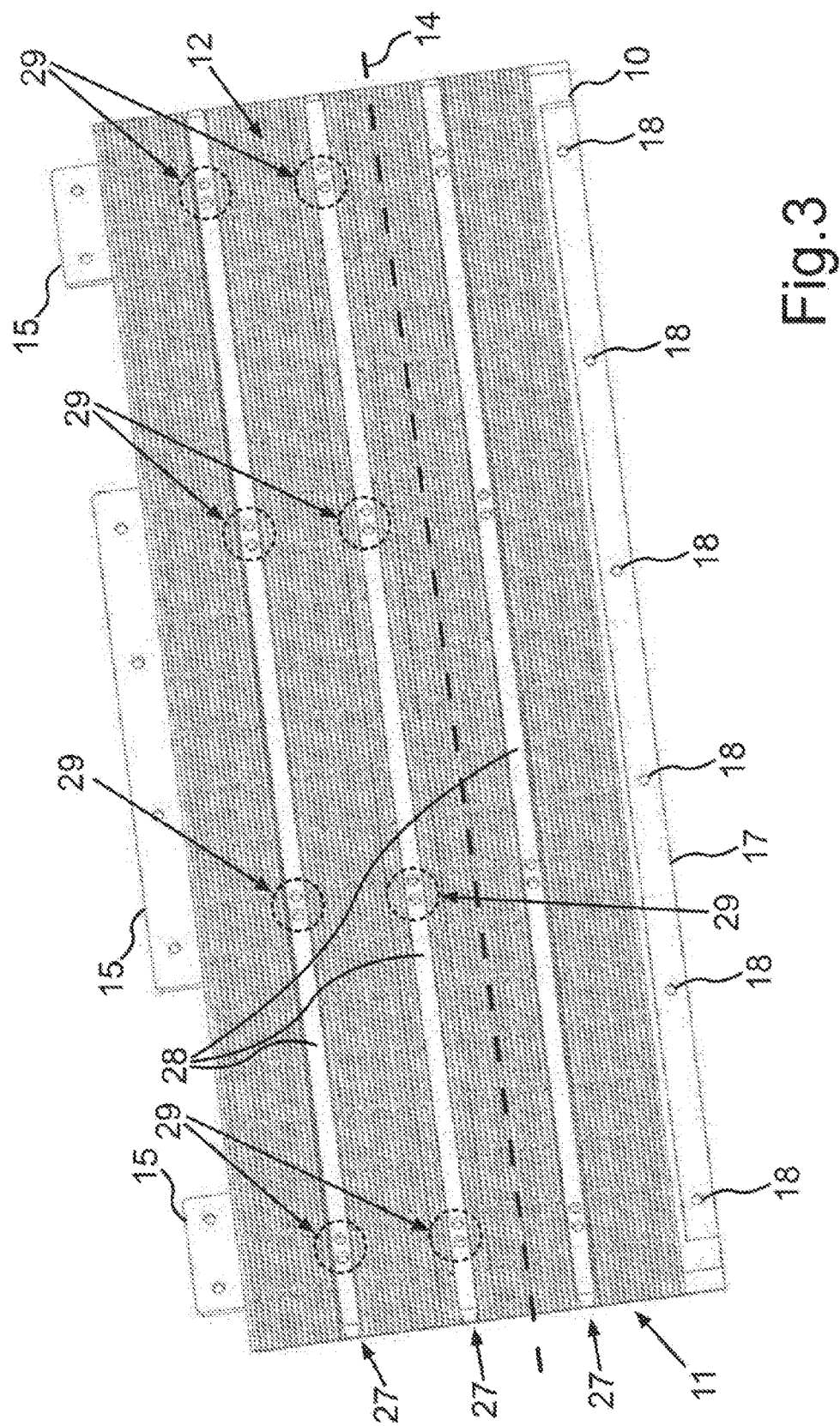
FIG. 3 shows a schematic illustration of a further example of a carrier element having carrier bars.

FIG. 3 visualizes how assembly strips 27 can be designed in the region of the honeycomb structure, in which assembly strips 27 carrier bars 28 can be integrally molded instead of the honeycomb structure 12. The carrier bars 28 can in each case have contact points 29 on which, or to which, additional components on the front side 24 of the carrier element 10 can be disposed or fastened, respectively, for example by a threaded connection.

Figure 4:
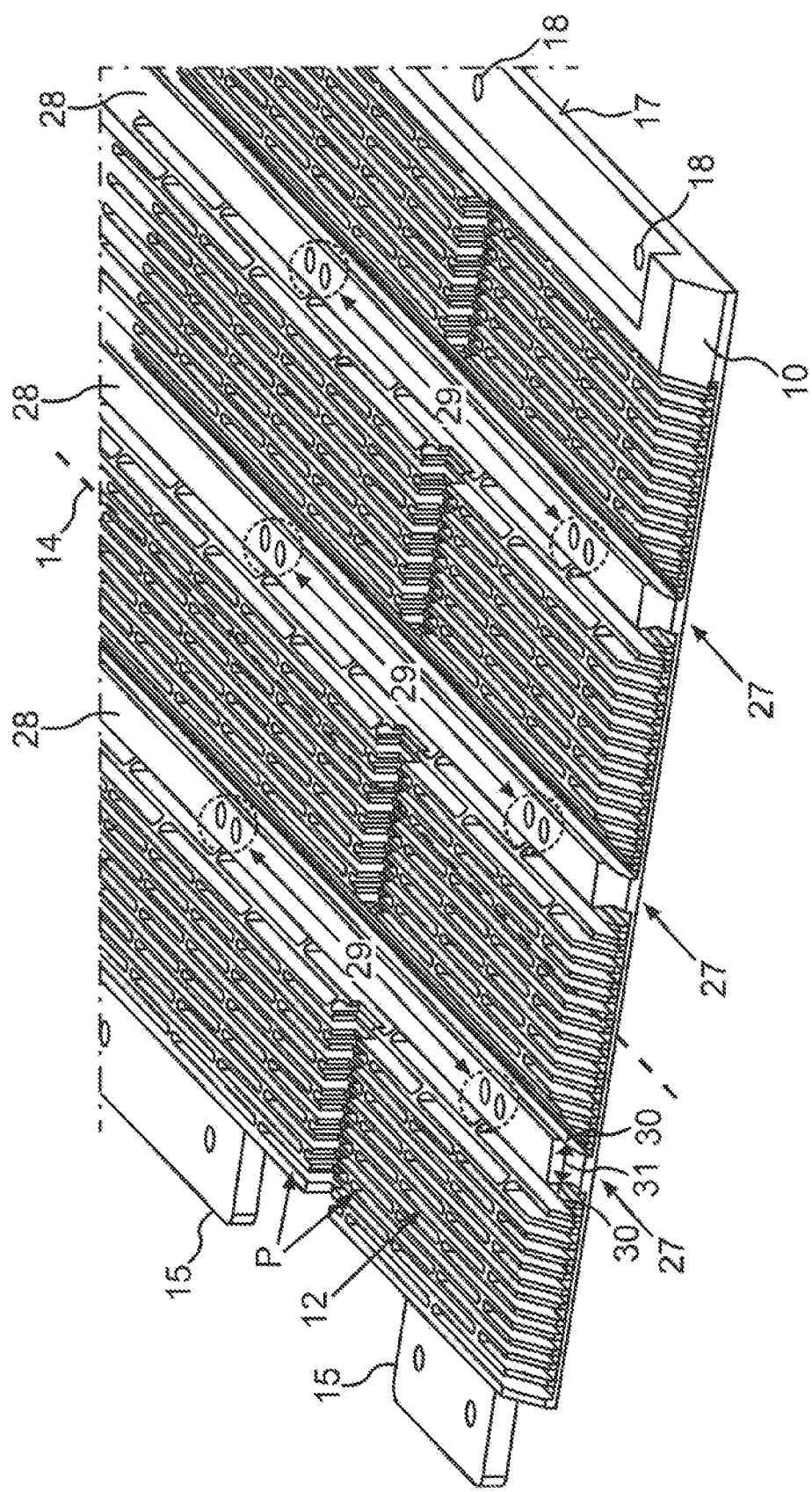
FIG. 4 shows a schematic illustration of a honeycomb structure and of the carrier bars of the carrier element of FIG. 3.

FIG. 4 visualizes how the carrier bars 28 can in each case have lateral walls 30 which are concavely bent and, as a result, have a taper 31 when viewed in a cross-sectional profile perpendicular to the rolling-up axis 14. Overall, this results in a T-profile or an H-profile in this cross section.

FIG. 4 furthermore visualizes how a height profile P can be shaped by different cell depths or cell heights of the cell walls 23, 26 by the honeycomb structure 12.

Figure 5:
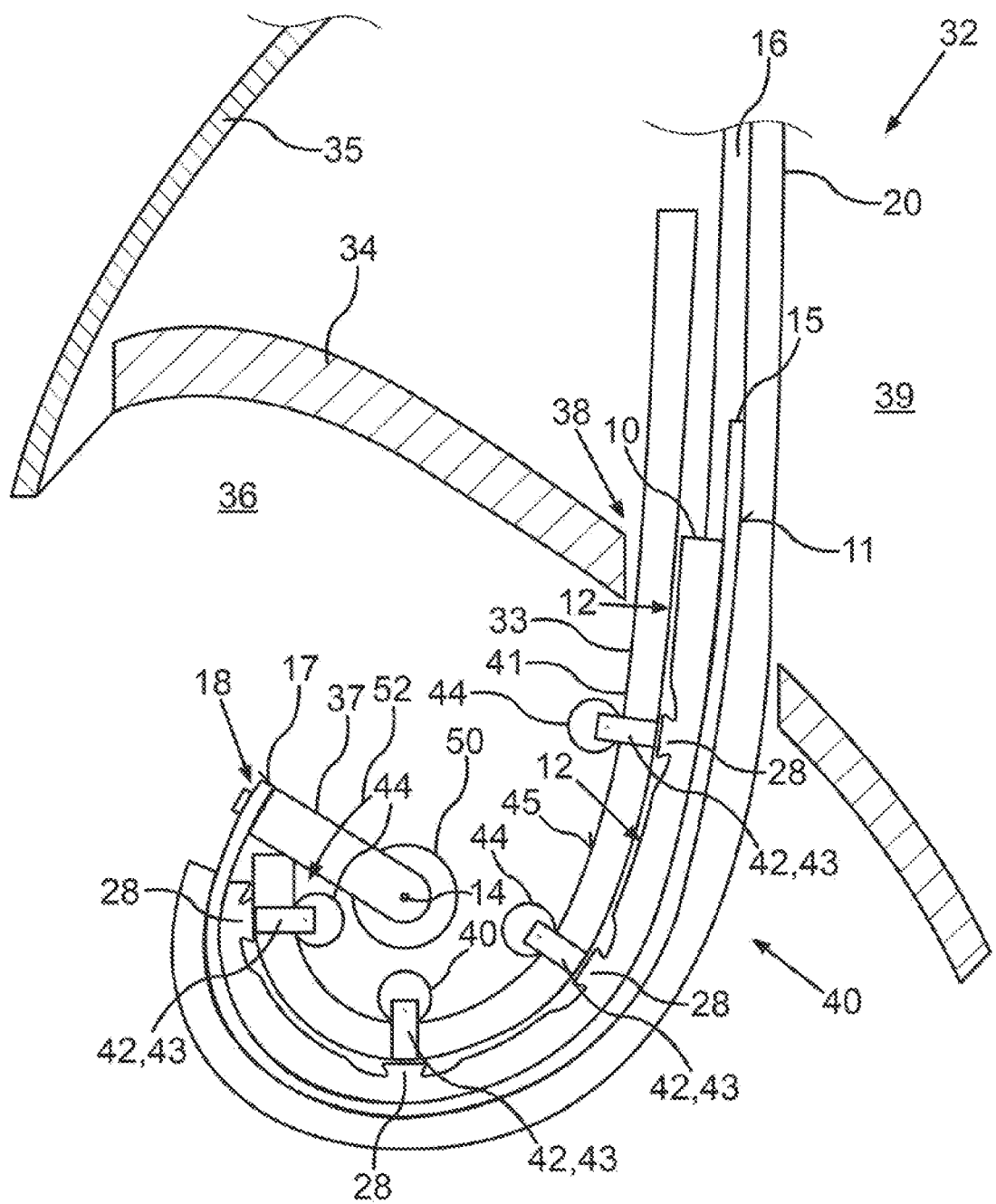
FIG. 5 shows a schematic illustration of a motor vehicle, according to an example, having a display device in which a carrier element is rolled up so as to form a roll shape.

FIG. 5 visualizes how a display device 33 having the carrier element 10 can be provided in a motor vehicle 32. Of the vehicle 32, an operator console 34 and a front glass or windshield 35 are illustrated in a cross section. A rolling mechanism 37 to which the carrier element 10 can be fastened can be provided in an interior 36 of the operator console 34. It is illustrated how the display film 20 can be held on the rear side 11 and on the plate 16. For example, the display film 20 can be adhesively bonded. In the display device 33, the display film 20 can be deployable from the interior 36 through a slot 38 of the operator console 34 and be able to be retracted into the interior 36, as is known per se from the related art. It can be provided herein that the display film 20, in the retracted state, in the region of the plate 16 furthermore protrudes from the slot 38 into an interior 39 of the motor vehicle 32, or remains deployed from the slot 38. In the retracted or rolled-in state, as is illustrated in FIG. 5, at least part of the carrier element 10 with the display film 20 disposed thereon can be rolled up so as to form a roll shape 40. For example, guide rails 41 along which the carrier element 10 can be moved by the rolling mechanism 37 can be provided. For this purpose, legs 43 as components 42 can be fastened, for example screwed, to the contact points 29 on the carrier bars 28, and a wheel 44 which can in each case roll on a rear side 45 of the guide rails 41 and in the process hold the carrier element 10 on the respective guide rails can in each case be rotatably mounted on the legs 43, so that the carrier element 10 with the display film 20 disposed thereon follows the curved profile, or the curved shape, of the guide rails 41. The rolling mechanism 37 can have an electric motor 50 which can set an arm element 51 in rotation 52, as a result of which the carrier element 10 can be pushed out of the slot 38 along the guide rails 41, or can be pulled into the slot 38.

Figure 6:
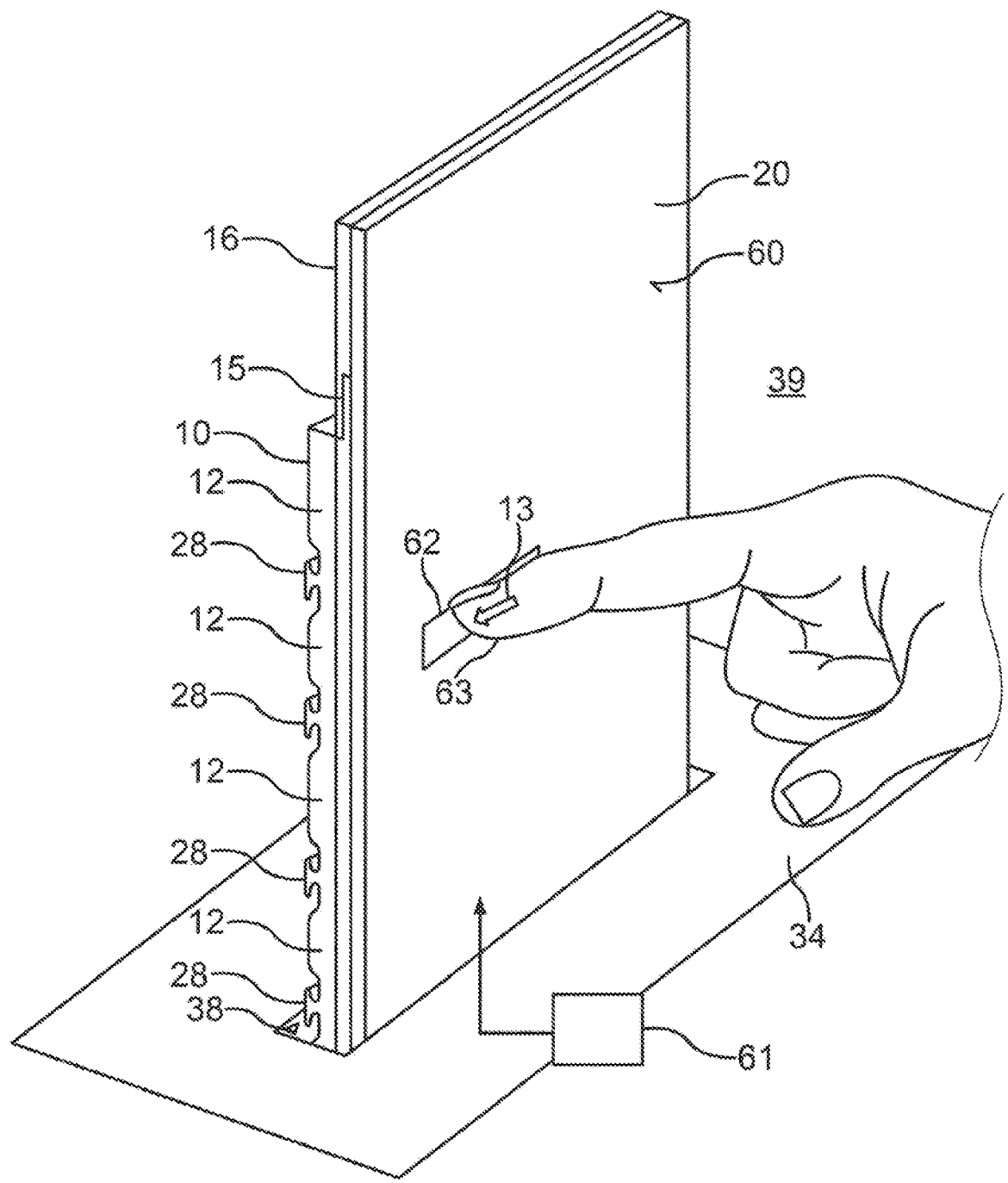
FIG. 6 shows a schematic illustration of a perspective view of the display device of FIG. 5, including the carrier element with a display film disposed thereon.

FIG. 6, in a perspective illustration, visualizes a potential deployed state of the carrier element 10 with the display film 20 disposed thereon. Illustrated is a display surface 60 which is formed by the display film 20 and on which a control circuit 61 can display at least one operator field 62 on the display surface 60 by actuating pixels of a pixel matrix of the display film 20, a vehicle function, for example the playback of media content (music and/or video), and/or the activating or switching of an illumination, and/or the setting of a driving operating mode, being able be controlled or adjusted by operating or touching or pressing the operator field 62 by a finger 63 of a user.

An optimized bending profile for the display film in the rolled-in state (FIG. 5) and a sufficient stiffness in the deployed state (FIG. 6) can be achieved by the carrier element.

In special applications a plurality of contact points 29 for assembling further functional components 42 on the display carrier (carrier element) are advantageous. The contact points 29 in the carrier bars can be designed to be sufficiently robust for a reliable transmission of force, this however not locally restricting the flexibility of the display carrier.

When a display film assembled on the display carrier is operated by touching, the operating force 13 now acting thereon can be distributed and dissipated. The honeycomb structure shown in FIG. 3 and FIG. 4 offers a sufficient possibility for a distribution of acting forces in this manner. For this purpose, the honeycomb structure shown in FIG. 3 and FIG. 4 is interrupted at defined locations in such a manner that reinforcement ribs can be incorporated without negatively affecting the previous bending behavior.

The incorporated reinforcement ribs are repeated exclusively in a direction which is orthogonal to the envisaged bending axis. The geometry of the incorporated reinforcement ribs or carrier bars, and their mutual spacing, herein is designed in such a manner that the superordinate bending structure, and the resultant global bending radius, are influenced to the least possible extent.

FIG. 1 shows the fundamental, uninterrupted honeycomb structure without the possibility of assembling further functional elements; FIG. 3 shows the modified honeycomb structure with regular reinforcement ribs/carrier bars; FIG. 2 shows a detailed view of the uninterrupted honeycomb structure; FIG. 4 shows a detailed view of the honeycomb structure with regular stiffening elements in the form of the reinforcement ribs/carrier bars.

Here are the substantial points of differentiation of the concept:
- this involves a support structure in the form of a carrier element which is integral;
- the support structure serves for receiving a flexible display film;
- the flexibility is generated by using a discontinuous honeycomb structure;
- the honeycomb structure is not embodied to be homogenous but there are profile regions with dissimilar height ratios, width ratios and aspect ratios;
- the honeycomb structure is interrupted by assembly regions with little or no flexibility;
- these inflexible assembly regions serve as receptacles for further components as assembly parts;
- the ratio of flexible honeycombs/cells to less flexible carrier bars is chosen in such a way that the local radii arising as a result of the less flexible carrier bars are greater than the minimum permissible radii of the flexible display film.

Overall, the examples show how a display carrier for a flexible display and an extension of a flexible carrier element for the assembly of further functional elements or components can be provided.

A description has been provided with particular reference to examples, but it will be understood that variations and modifications can be effected within the spirit and scope of the claims, which may include the phrase "at least one of A, B and C" as an alternative expression that refers to one or more of A, B or C, contrary to the holding in *Superguide* v. *DIRECTV,* 358 F3d 870, 69 USPQ2d 1865 (Fed. Cir. 2004).

The invention claimed is:

1. A display device to display content, comprising:
  a display film to display the content which is pixel-based display content;
  a flexible carrier element including a rear side which bears the display film; and
  a rolling mechanism to allow at least a part of the display film and at least a part of the flexible carrier element to roll about a rolling-up axis so as to form a roll shape;
  wherein the flexible carrier element is configured as a carrier film on which is configured a support structure that projects perpendicular from the carrier film and extends on a side of the carrier film facing away from the display film, and
  the support structure includes a plurality of cells that are open on one side and delimited on an opposite side by a cell base, respectively, and the plurality of cells include cell sides delimited by cell walls projecting perpendicular from the carrier film, wherein the plurality of cells share a cell wall in pairs to thereby form a honeycomb structure,
  the flexible carrier element includes assembly regions, which are strip-shaped, aside from the support structure and along a longitudinal direction of the flexible carrier element aligned parallel to the rolling-up axis,
  wherein, the flexible carrier element includes carrier bars, a respective carrier bar that is rigid is configured on the carrier film in a respective assembly region, among the assembly regions, and the respective carrier bar includes an assembly installation having at least one contact point to fasten an electrical and/or mechanical component,
  wherein the respective carrier bar has at least one of a cross-sectional profile in which a taper is configured in a region of lateral walls of the respective carrier bar, and/or has a smaller width on a carrier base of the carrier film, where the respective carrier bar transitions into the carrier film, than on an opposite carrier side.

2. The display device as claimed in claim 1, wherein the flexible carrier element as the carrier film and the cell walls projecting perpendicular from the carrier film and the carrier bars are integrally designed.

3. The display device as claimed in claim 1, wherein the display film is designed to be touch sensitive, and a control circuit of the display device is specified to display at least one operator field for a touch input as the content displayed on the display film.

4. The display device as claimed in claim 1, wherein the plurality of cells are designed as rectangular honeycombs and two of the cell walls are in each case aligned along an axial direction parallel to the rolling-up axis, and another two cell walls are aligned along a circumferential direction of the roll shape,
  wherein the rectangular honeycombs along a longitudinal direction are aligned parallel to the rolling-up axis.

5. The display device as claimed in claim 4, wherein the plurality of cells of the honeycomb structure are disposed in cell rows (R) parallel to the rolling-up axis, and the cell walls of the plurality of cells that extend perpendicular to the rolling-up axis are in such a way that a surface normal thereof is aligned parallel to the rolling-up axis so as to be mutually offset with respect to respective adjacent cell rows.

6. The display device as claimed in claim 1, wherein the honeycomb structure includes dissimilar cell groups (B) of the plurality of cells which differ from one another due to at least one dissimilar cell dimension in terms of a cell wall height (H), an aspect ratio of a cell length parallel to the rolling-up axis, and a cell width perpendicular to the rolling-up axis.

7. The display device as claimed in claim 1, wherein the honeycomb structure includes dissimilar cell groups (B) of the plurality of cells which differ from one another due to at least one dissimilar cell dimension in terms of a cell length and a cell width.

8. The display device as claimed in claim 1, wherein a cell wall thickness of the cell walls that extend parallel to the rolling-up axis is greater than a cell wall thickness of the cell walls that extend perpendicular to the rolling-up axis.

9. A carrier element for the display device as claimed in claim 1, comprising:
  at least one flexible material to form the carrier element which is configured as the carrier film on which is configured the support structure projecting perpendicular from the carrier film,
  wherein the support structure has a plurality of cells which are open on one side and delimited on an opposite side by a cell base, respectively, and the plurality of cells include cell sides delimited by cell walls projecting perpendicular from the carrier film, wherein the plurality of cells share a respective cell wall in pairs to thereby form the honeycomb structure.

10. A carrier element for the display device as claimed in claim 2, comprising:
  at least one flexible material to form the carrier element which is configured as a carrier film on which is configured the support structure projecting perpendicular from the carrier film,
  wherein the support structure has a plurality of cells which are open on one side and delimited on an opposite side by a cell base, respectively, and the plurality of cells include cell sides delimited by cell walls projecting perpendicular from the carrier film, wherein the plurality of cells share a respective cell wall in pairs to thereby form the honeycomb structure.

11. A motor vehicle having the display device as claimed in claim 1.

12. A motor vehicle having the display device as claimed in claim 2.

13. A motor vehicle having the display device as claimed in claim 1.

* * * * *